US011108224B1

(12) United States Patent
Deng et al.

(10) Patent No.: US 11,108,224 B1
(45) Date of Patent: Aug. 31, 2021

(54) ELECTRIC CIRCUIT STRUCTURE FOR SHORT CIRCUIT PROTECTION

(71) Applicant: LEADER ELECTRONICS INC., New Taipei (TW)

(72) Inventors: Shi-Guo Deng, New Taipei (TW); Zuo-Quan Zhou, New Taipei (TW); Jing Feng, New Taipei (TW)

(73) Assignee: Leader Electronics Inc., New Taipei (TW)

( * ) Notice: Subject to any disclaimer, the term of this patent is extended or adjusted under 35 U.S.C. 154(b) by 0 days.

(21) Appl. No.: 16/934,273

(22) Filed: Jul. 21, 2020

(30) Foreign Application Priority Data

Jun. 5, 2020 (TW) .................................. 109207067

(51) Int. Cl.
*H02H 3/08* (2006.01)
*G01R 31/00* (2006.01)

(52) U.S. Cl.
CPC ............. *H02H 3/085* (2013.01); *G01R 31/00* (2013.01)

(58) Field of Classification Search
CPC ......... H02H 3/085; H01L 22/00; H01L 22/30; H01L 22/32; H01L 22/34; G01R 31/00–74
See application file for complete search history.

(56) References Cited

U.S. PATENT DOCUMENTS

| 6,441,637 B1* | 8/2002 | Neeb | G01R 31/2853 |
| | | | 324/762.02 |
| 8,203,345 B2* | 6/2012 | Bertness | G01R 31/388 |
| | | | 324/426 |
| 2015/0028892 A1* | 1/2015 | Yeh | G01R 31/317 |
| | | | 324/654 |

FOREIGN PATENT DOCUMENTS

| CN | 209233112 U | 8/2019 |
| CN | 209294101 U | 8/2019 |
| CN | 209375469 U | 9/2019 |
| CN | 211128300 U | 7/2020 |

OTHER PUBLICATIONS

EP Search Report dated Jan. 29, 2021 for corresponding EP Application No. 20189940.8.

* cited by examiner

*Primary Examiner* — Danny Nguyen
*Assistant Examiner* — Christopher J Clark
(74) *Attorney, Agent, or Firm* — Rosenberg, Klein & Lee

(57) ABSTRACT

An improved electric circuit structure for short circuit protection is applicable to examining a device under test, comprising a circuit breaking element, a thermistor, a filtering and rectifying module and a capacitor. A first end of the circuit breaking element is electrically connected to a power source. A first end of the thermistor is electrically connected to a ground. The filtering and rectifying module is connected between the second end of the circuit breaking element and the second end of the thermistor. The capacitor is connected to the filtering and rectifying module and in parallel with the device under test. The circuit breaking element disclosed in the present invention is a multi-protector fuse and forms an open circuit when the device under test forms a short circuit. Meanwhile, the multi-protector fuse is able to withstand voltage between its first and second end without generating any physical damage.

10 Claims, 3 Drawing Sheets

| multi-protector fuse | No damage | No black areas | No sparkling on the exterior of the product | Hi-pot test |
|---|---|---|---|---|
| sample 1 | ✓ | ✓ | ✓ | ✓ |
| sample 2 | ✓ | ✓ | ✓ | ✓ |
| sample 3 | ✓ | ✓ | ✓ | ✓ |
| sample 4 | ✓ | ✓ | ✓ | ✓ |
| sample 5 | ✓ | ✓ | ✓ | ✓ |
| sample 6 | ✓ | ✓ | ✓ | ✓ |

Fig. 3

ELECTRIC CIRCUIT STRUCTURE FOR SHORT CIRCUIT PROTECTION

This application claims priority for Taiwan patent application no. 109207067 filed on 5 Jun. 2020, the content of which is incorporated by reference in its entirely.

BACKGROUND OF THE INVENTION

Field of the Invention

The present invention relates to an electric circuit structure for short circuit protection, and more particularly to an improved electric circuit structure for short circuit protection in which a multi-protector fuse is employed as its circuit breaking element thereof.

Description of the Prior Art

In general, "Short circuit" is referred as in a normal circuit condition where two ends having different electrical potentials (voltages) are improperly in direct contact or connected by a conductor with a very small impedance (or resistance). When a short circuit is generated, the current intensity becomes extremely high, which may damage its electrical equipment or even cause a fire. In a general power system operation, when the short circuit condition occurs, an abnormal connection (that is, the short circuit) occurs between phase and phase or between phase and ground (or a neutral line), resulting in an extremely large amount of current flow being induced. The amount of current flow is much higher than its limited value, and is dependent on the electrical distance of the short circuit point away from the power supply source. For example, when a short circuit is generated at the generator side, the maximum instantaneous value of the short-circuit current flowing through the generator can be 10 to 15 times as high as its limited current value. In an even large-capacity power system, the short-circuit current can even reach tens of thousands of amperes. All of these will have severe impacts and consequences on the normal operations of the power system.

Since a short circuit is an abnormal and low-resistance circuit condition, which results in larger current and may cause circuit damage, overheating, fire, explosion, or the like due to an even excessive current value, as such, it is believed that the short-circuit tests and verifications must be applied to most of the electrical devices to meet their safety standard requirements. For example, it has been known that the hazards caused by short circuits can be prevented (such as using verified circuits that comply with building and electrical usage specifications).

Alternatively, fuses, circuit breakers, or other overload protectors can also be used to cut out the electrical path when the current is too high for protecting its main test device thereof. However, a general fuse, also known as a circuit breaker, is a typical disposable component connected to the circuit for protection scheme only used for one time. A commonly used fuse is usually composed of filiform or sheet materials made by lead-tin alloy, zinc, copper, or silver, which are characterized by low melting points and large resistivity values. Therefore, when a short circuit condition occurs in the circuit electrical path and the current flowing through it is too large, the metal wire or metal sheet therein will be melted due to the high temperature, resulting in an open circuit and interrupting the current. Consequently, the main circuit can be protected and prevented from being damaged. Nevertheless, it is worth noting that, at the same time, the fuse itself will become sooty, blackened, or damaged. The fuse even needs to be manually replaced by a new one to resume its normal operation after it was melted. As such, it is apparent that the conventional fuse is only available for one-time use, and the time and cost for manual replacement are greatly increased and can not be avoided.

Therefore, on account of above, to overcome the above-mentioned problem, it should be obvious that there is indeed an urgent need for the professionals in the field for a new improved electric circuit structure for short circuit protection to be developed that can effectively solve the above mentioned problem occurring in the prior design and its specific implementations will be fully described in the following paragraphs.

SUMMARY OF THE INVENTION

In order to overcome the above mentioned disadvantages, one major objective in accordance with the present invention is provided for a novel improved electric circuit structure for short circuit protection. By employing the proposed electric circuit structure for short circuit protection of the present invention, it is applicable to examining a short circuit of a device under test, and cuts out the electrical path so as to protect its main core electronic device when the current is too high.

And yet, another major objective in accordance with the present invention is provided for the improved electric circuit structure for short circuit protection. When the device under test form a short circuit, its circuit breaking element thereof is able to form an open circuit to cut out the current so as to protect the device under test from being damaged. At the same time, the circuit breaking element itself has no physical injury and damage, whereby the step for repeatedly replacing the conventional circuit breaking element can be effectively prevented, and the increasing cost of test circuit structure can be avoided as well.

And also, another further major objective in accordance with the present invention is provided for the improved electric circuit structure for short circuit protection. When applying the circuit structure for short circuit protection to a device under test, its test specifications fully comply with the No-Arc, No-Fire, No-Smoke, and No-Damage Electric Short Circuit Test Standard.

For achieving the above mentioned objectives, the technical solutions of the present invention are aimed to provide an improved electric circuit structure for short circuit protection, which is applicable to examining a device under test. The improved electric circuit structure for short circuit protection comprises: a circuit breaking element, including a first end and a second end, wherein the first end of the circuit breaking element is electrically connected to a power source; a thermistor, including a first end and a second end, wherein the first end of the thermistor is electrically connected to a ground; a filtering and rectifying module, being electrically connected between the second end of the circuit breaking element and the second end of the thermistor; and a capacitor electrically connected to the filtering and rectifying module and in parallel with the device under test.

When the device under test forms a short circuit, an open circuit is formed by the circuit breaking element to protect the device under test from being damaged. In one embodiment, the proposed circuit breaking element in the present invention is a multi-protector fuse, and the multi-protector fuse is able to withstand voltage between its first end and second end without any physical damage when the device under test forms the short circuit.

To be more specific, a fusing time of such multi-protector fuse is less than 120 seconds. A leakage current of the multi-protector fuse is less than 2 milliamperes (mA). And an allowable temperature range of the multi-protector fuse is up to 190° C. to 230° C.

Furthermore, according to one embodiment of the present invention, the thermistor to be used, for instance, can be a Negative Temperature Coefficient (NTC) thermistor.

In another aspect, the foregoing filtering and rectifying module may be composed of a common mode inductor, a surge protection element and a bridge rectifier assembly, wherein the surge protection element is electrically connected with the second end of the circuit breaking element and the second end of the thermistor. For example, the surge protection element is a metal oxide varistor (MOV).

The second end of the circuit breaking element and the second end of the thermistor is further connected to a first side of the common mode inductor. The common mode inductor can be formed, comprising two coils which are winding a magnetic ring (Ferrite Core), respectively. In addition, according to the embodiment of the present invention, the bridge rectifier assembly includes a first diode, a second diode, a third diode and a fourth diode. A first node is electrically formed between the first diode and the second diode, a second node is electrically formed between the first diode and the third diode, a third node is electrically formed between the third diode and the fourth diode, and a fourth node is electrically formed between the second diode and the fourth diode.

Moreover, the first node and the third node of the bridge rectifier assembly are commonly connected to a second side of the common mode inductor, in which the second side is disposed opposite to the above mentioned first side. And, the second node and the fourth node of the bridge rectifier assembly are connected to two opposite ends of the capacitor, respectively.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3 shows experimental data results when applying the improved electric circuit structure for short circuit protection in accordance with the embodiment of the present invention to a device under test.

DESCRIPTION OF THE PREFERRED EMBODIMENTS

Figure 1:
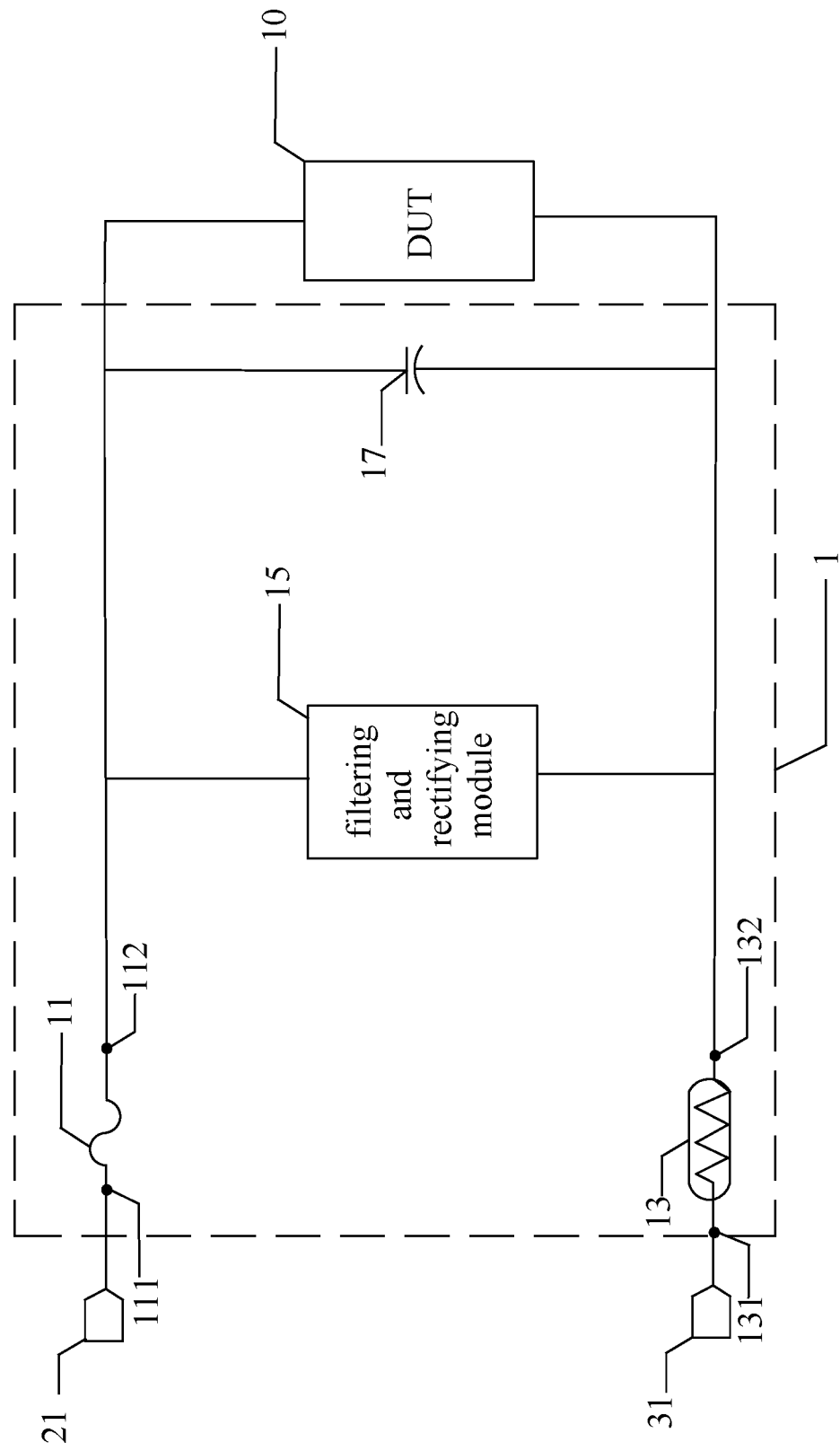
FIG. 1 shows a block diagram of an improved electric circuit structure for short circuit protection in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Please refer to FIG. 1. The present invention provides an improved electric circuit structure for short circuit protection 1, which is applicable to examining a device under test (DUT) 10. According to the embodiment of the present invention, the improved electric circuit structure for short circuit protection 1 comprises a circuit breaking element 11, a thermistor 13, a filtering and rectifying module 15, and a capacitor 17. The circuit breaking element 11 includes a first end 111 and a second end 112. The first end 111 of the circuit breaking element 11 is electrically connected to a power source 21. Similarly, the thermistor 13 also includes a first end 131 and a second end 132 of its own. The first end 131 of the thermistor 13 is electrically connected to a ground 31. The filtering and rectifying module 15 is electrically connected between the second end 112 of the circuit breaking element 11 and the second end 132 of the thermistor 13. The capacitor 17 is electrically connected to the filtering and rectifying module 15, and the capacitor 17 is electrically in parallel with the device under test 10. According to the embodiment of the present invention, when the device under test 10 forms a short circuit, an open circuit is formed by the circuit breaking element 11 to interrupt the current and protect the device under test 10 from being damaged.

In details, in order to prevent circuit overload and the occurrence of phenomena such as the conventional fuse getting burned, sooty or blackened when forming an open circuit, the present invention is aimed to sophisticatedly design the material and specifications of the circuit breaking element 11 to be proposed. According to the embodiment disclosed in the present invention, the proposed circuit breaking element 11 is a multi-protector fuse, which complies with the safety specification of IEC-62368 OVC III requirement. The fusing time of such multi-protector fuse is less than 120 seconds. Its leakage current is less than 2 milliamperes (mA), and an allowable temperature range of such multi-protector fuse is up to 190° C. to 230° C. By employing the accurate consideration and design manners, according to the improved electric circuit structure for short circuit protection 1 disclosed by the present invention, when the device under test 10 forms a short circuit, the circuit breaking element 11 used thereof, which is, the aforementioned multi-protector fuse, is able to withstand voltage between its first end 111 and second end 112. And meanwhile, there won't be any physical damage, comprising injury, burning, blackening, etc. on the appearance of the multi-protector fuse. In addition, no sparkling shows on the exterior of the product when the circuit structure of the present invention is applied, which are in fully accordance with the objectives and purposes of the present invention.

Figure 2:
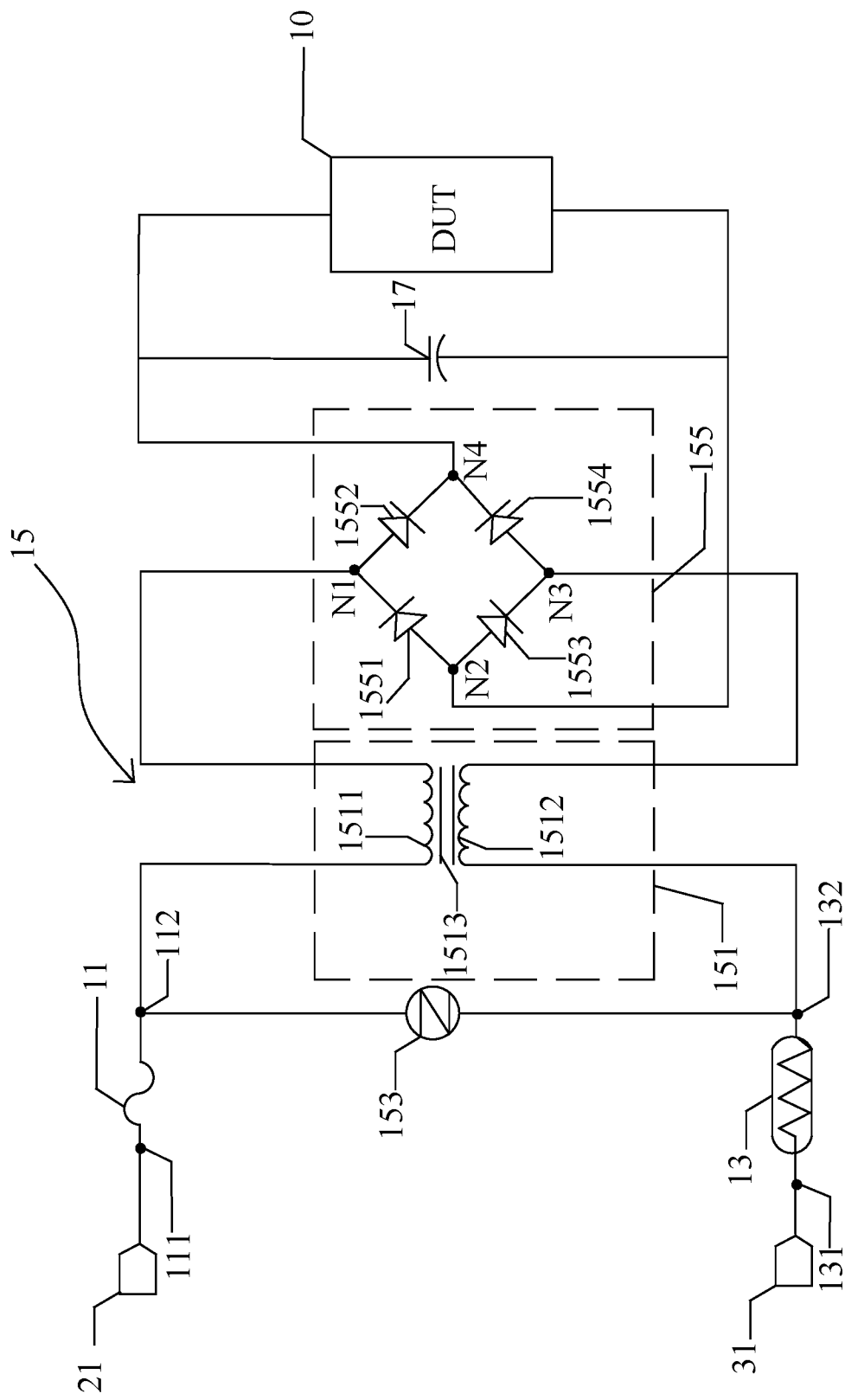
FIG. 2 shows a detailed circuit diagram of FIG. 1 in accordance with the embodiment of the present invention.

Please refer to FIG. 2, which shows a detailed circuit diagram of FIG. 1 in accordance with the embodiment of the present invention. As shown in FIG. 2, the filtering and rectifying module 15 comprises a common mode inductor 151, a surge protection element 153 and a bridge rectifier assembly 155. The surge protection element 153 is electrically connected with the second end 112 of the circuit breaking element 11 and the second end 132 of the thermistor 13. According to the embodiment of the present invention, the surge protection element 153, for example, can be a metal oxide varistor (MOV). The resistance of the metal oxide varistor is strongly affected by the voltage, causing its current to rise dramatically as the voltage increases, and the rising curve usually shows a nonlinear one. In general, the metal oxide varistor (MOV) is in a high resistance condition under a normal operating voltage. When a surge occurs, the MOV will be conducted, and a strong current will flow into the ground through the MOV. After the surge is finished, the metal oxide varistor immediately returns to its high resistance condition, thereby avoiding the breakdown and punch-through effect due to the transient voltage.

Moreover, the second end 112 of the circuit breaking element 11 and the second end 132 of the thermistor 13 is further connected to a first side of the common mode inductor 151. According to the embodiment of the present invention, the common mode inductor 151 is formed, comprising two coils 1511, 1512 which are winding a magnetic ring (Ferrite Core) 1513, respectively.

The bridge rectifier assembly 155 include a first diode 1551, a second diode 1552, a third diode 1553 and a fourth diode 1554. A first node N1 is electrically formed between the first diode 1551 and the second diode 1552. A second node N2 is electrically formed between the first diode 1551 and the third diode 1553. A third node N3 is electrically formed between the third diode 1553 and the fourth diode 1554. A fourth node N4 is electrically formed between the second diode 1552 and the fourth diode 1554. In addition, the first node N1 and the third node N3 of the bridge rectifier assembly 155 are commonly connected to a second side of the common mode inductor 151, in which the second side is disposed opposite to the aforementioned first side described earlier. On the other hand, the second node N2 and the fourth node N4 of the bridge rectifier assembly 155 are connected to two opposite ends of the capacitor 17, respectively.

According to the embodiment of the present invention, the thermistor 13 to be used, for instance, can be a Negative Temperature Coefficient (NTC) thermistor. People who are skilled in the art are allowed to adjust and make modifications according to their actual production needs, and yet the present invention is definitely not limited thereto.

In the following, the Applicants further provides experimental data results when applying the improved electric circuit structure for short circuit protection of the present invention to a device under test. The extraordinary effects of the present invention are verified at the same time. Please refer to FIG. 3, in which the multi-protector fuses of a sample 1, sample 2, sample 3, sample 4, sample 5, and sample 6 are provided to perform the short circuit test. The input voltage is AC power 90-260 volts, frequency at 50/60 Hz, and the test specifications fully meet with the No-Arc, No-Fire, No-Smoke, and No-Damage Electric Short Circuit Test Standard. From the data analysis provided by the present invention, it is evident that, by employing the technical solutions disclosed in the embodiments of the present invention, when the device under test forms a short circuit, the multi-protector fuse proposed in the present invention not only shows no physical injury, comprising damage and black areas, but also generates no sparkling on the exterior of the product. Meanwhile, the test result is successfully verified to pass the electrical safety standard of DC 4 kV Hi-pot test as well.

Therefore, to sum above, it is apparent that, compared to the conventional technologies, the improved electric circuit structure for short circuit protection of the present invention is definitely bringing a novel technical solution that has never been seen before to the circuit designers. It effectively solves the drawbacks that the conventional fuse can only be used once, and meanwhile avoids the increase of the test circuit structure cost.

Furthermore, the improved electric circuit structure for short circuit protection of the present invention are verified to comply with the No-Arc, No-Fire, No-Smoke, and No-Damage Electric Short Circuit Test Standard. Also, the electrical safety standard of withstand voltages are passed. By employing the selection of such new material of the multi-protector fuse along with the accurate circuit structure design configuration, the Applicants assert that the present invention is instinct, effective and highly competitive for incoming technologies, industries and researches developed in the future. It is obvious that the technical features, means and effects achieved by the present invention are significantly different from the current solutions, and can not be accomplished easily by those who are familiar with the industry. As a result, it is believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An improved electric circuit structure for short circuit protection, which is applicable to examining a device under test, comprising:
 a circuit breaking element, including a first end and a second end, wherein said first end of said circuit breaking element is electrically connected to a power source;
 a thermistor, including a first end and a second end, wherein said first end of said thermistor is electrically connected to a ground;
 a filtering and rectifying module, being electrically connected between said second end of said circuit breaking element and said second end of said thermistor; and
 a capacitor, being electrically connected to said filtering and rectifying module and in parallel with said device under test;
 wherein when said device under test forms a short circuit, an open circuit is formed by said circuit breaking element to protect said device under test from being damaged.

2. The improved electric circuit structure for short circuit protection of claim 1, wherein said circuit breaking element is a multi-protector fuse, and said multi-protector fuse is able to withstand voltage between said first end and said second end of said circuit breaking element when said device under test forms said short circuit.

3. The improved electric circuit structure for short circuit protection of claim 2, wherein a fusing time of said multi-protector fuse is less than 120 seconds.

4. The improved electric circuit structure for short circuit protection of claim 2, wherein a leakage current of said multi-protector fuse is less than 2 milliamperes (mA).

5. The improved electric circuit structure for short circuit protection of claim 2, wherein an allowable temperature range of said multi-protector fuse is up to 190° C. to 230° C.

6. The improved electric circuit structure for short circuit protection of claim 1, wherein said thermistor is a Negative Temperature Coefficient (NTC) thermistor.

7. The improved electric circuit structure for short circuit protection of claim 1, wherein said filtering and rectifying module comprises a common mode inductor, a surge protection element and a bridge rectifier assembly, said surge protection element is electrically connected with said second end of said circuit breaking element and said second end of said thermistor, said second end of said circuit breaking element and said second end of said thermistor is further connected to a first side of said common mode inductor, said bridge rectifier assembly includes a first node, a second node, a third node and a fourth node, said first node and said third node of said bridge rectifier assembly are commonly connected to a second side of said common mode inductor, in which said second side is disposed opposite to said first side, and said second node and said fourth node of said bridge rectifier assembly are connected to two opposite ends of said capacitor, respectively.

8. The improved electric circuit structure for short circuit protection of claim 7, wherein said common mode inductor is formed, comprising two coils which are winding a magnetic ring (Ferrite Core), respectively.

9. The improved electric circuit structure for short circuit protection of claim 7, wherein said bridge rectifier assembly includes a first diode, a second diode, a third diode and a fourth diode, said first node is electrically formed between said first diode and said second diode, said second node is electrically formed between said first diode and said third diode, said third node is electrically formed between said third diode and said fourth diode, and said fourth node is electrically formed between said second diode and said fourth diode.

10. The improved electric circuit structure for short circuit protection of claim 7, wherein said surge protection element is a metal oxide varistor (MOV).

\* \* \* \* \*